(12) United States Patent  (10) Patent No.: US 7,723,914 B2
Yang et al.  (45) Date of Patent: May 25, 2010

(54) WHITE ORGANIC LIGHT-EMITTING DIODE

(75) Inventors: Chun-Hui Yang, Fuli Township, Hualien County (TW); Cheng-Hung Lin, Hemei Township, Changhua County (TW)

(73) Assignee: Au Optronics Corporation, Hsinchu (TW)

( * ) Notice: Subject to any disclaimer, the term of this patent is extended or adjusted under 35 U.S.C. 154(b) by 339 days.

(21) Appl. No.: 11/370,663

(22) Filed: Mar. 8, 2006

(65) Prior Publication Data

US 2007/0035240 A1 Feb. 15, 2007

(30) Foreign Application Priority Data

Aug. 9, 2005 (TW) .............................. 94127032 A

(51) Int. Cl.
*H01J 1/62* (2006.01)
(52) U.S. Cl. ..................... 313/504; 313/505; 428/690
(58) Field of Classification Search .......... 313/500–505
See application file for complete search history.

(56) References Cited

U.S. PATENT DOCUMENTS

| | | | |
|---|---|---|---|
| 5,707,745 | A | 1/1998 | Forrest et al. |
| 6,274,980 | B1 * | 8/2001 | Burrows et al. ............. 313/506 |
| 6,627,333 | B2 | 9/2003 | Hatwar |
| 2002/0028232 | A1 | 3/2002 | Kubota |
| 2002/0197511 | A1 | 12/2002 | D'Andrade et al. |
| 2003/0124381 | A1 | 7/2003 | Thompson et al. |
| 2003/0175553 | A1 | 9/2003 | Thompson et al. |
| 2004/0048101 | A1 | 3/2004 | Thompson et al. |
| 2004/0164667 | A1 * | 8/2004 | Dedene et al. .............. 313/500 |
| 2005/0008897 | A1 * | 1/2005 | Thompson et al. .......... 428/690 |

FOREIGN PATENT DOCUMENTS

| JP | 2002184574 A | * | 6/2002 |
|---|---|---|---|
| TW | 294842 | | 1/1997 |
| TW | 228325 | | 2/2005 |

OTHER PUBLICATIONS

English Translation of JP2002-184574 (Foreign Patent Document cited by Applicant in IDS).*
B. D'Andrade and S. Forrest; "White Organic Light-Emitting Devices for Solid-State Lighting;" Sep. 2004; pp. 1585-1595.
S. Tokito, T. Tsuzuki, F. Sato, and T. Ijimia; "High-Efficiency Blue and White Phosphorescent Organic Light-Emitting Devices;" Nov. 2003; pp. 331-336.
English language translation of abstract and pertinent parts of CN 1700486.

* cited by examiner

*Primary Examiner*—Nimeshkumar D. Patel
*Assistant Examiner*—Mary Ellen Bowman
(74) *Attorney, Agent, or Firm*—Thomas, Kayden, Horstemeyer & Risley

(57) ABSTRACT

A white organic light-emitting diode includes two symmetric emission layers and a middle emission layer. The two symmetric emission layers emit a first color light with approximately the same frequency components. The middle emission layer is located between the two symmetric emission layers. The middle emission layer emits a second color light with frequency components different from main frequency components of the first color light. When the voltage applied to the organic light-emitting diode changes and leads to a decrease of luminescent intensity of one of the symmetric emission layers, the other symmetric emission layer automatically increases the luminescent intensity to compensate for the reduced light intensity.

8 Claims, 2 Drawing Sheets

WHITE ORGANIC LIGHT-EMITTING DIODE

RELATED APPLICATIONS

The present application is based on, and claims priority from, Taiwan Application Serial Number 94127032, filed Aug. 9, 2005, the disclosure of which is hereby incorporated by reference herein in its entirety.

BACKGROUND OF THE INVENTION

1. Field of Invention

The present invention relates to a light-emitting device. More particularly, the present invention relates to an organic light-emitting diode.

2. Description of Related Art

A white-light organic light-emitting diode (WOLED) can be made by a single luminescent layer or multiple luminescent layers. However, the color of the emitting light of the same WOLED varies when the applied operating voltage varies. That is, the wavelength of the emitted light is shifted by applying different operating voltages to the WOLED.

The individual layers of a conventional WOLED are a substrate, an anode (ITO), a hole injection layer (PEDOT:PSS, 40 nm), a hole transfer layer (α-NPD, 40 nm), a blue light-emitting layer (($CF_3$ppy)$_2$Ir(pic):CDBP, 25 nm)), a hole barrier layer (BAlq, 3 nm), a red light-emitting layer (Ir(btp)$_2$(acac):CDBP, 10 nm), an electron transfer layer (BAlq, 45 nm), an electron injection layer (LiF, 0.5 nm), and a cathode (Al, 150 nm). The red light (600-700 nm) emitting intensity becomes greater as the applied voltage of WOLED is increased (Current Applied Physics 2005, Vol. 5, pp. 331-336). Because of this increasing red shift, controlling the emitting light color of a WOLED is difficult.

SUMMARY OF THE INVENTION

It is therefore an aspect of the present invention to provide a WOLED capable of compensating for color shift of its emitting light due to applied voltage variation.

In another aspect, the present invention provides a WOLED, which can be easily fabricated and can decrease color shift of its emitting light.

In yet another aspect, the present invention provides a WOLED with a simple structure to decrease color shift of its emitting light.

In accordance with the foregoing and other aspects of the present invention, a symmetric organic light-emitting device is provided. According to a preferred embodiment of this invention, the symmetric organic light-emitting device comprises two symmetric luminescent layers and a central luminescent layer located between the two symmetric luminescent layers. The two symmetric luminescent layers can generate a first color light having main peaks of about the same frequency. The central luminescent layer generates a second color light having a main peak with a different frequency from the first color light. When a voltage applied to the organic light-emitting device changes to cause decreasing luminescent intensity of one of the two symmetric luminescent layers, the luminescent intensity of the other symmetric luminescent layer automatically increases to compensate for the decreased luminescent intensity.

In the foregoing, the invention allows two symmetric luminescent layers located on both sides of a central luminescent layer to generate a same color light. Therefore, the problem of color shift cased by applied voltage variation can be resolved.

It is to be understood that both the foregoing general description and the following detailed description are made by use of examples and are intended to provide further explanation of the invention as claimed.

BRIEF DESCRIPTION OF THE DRAWINGS

The accompanying drawings are included to provide a further understanding of the invention and are incorporated in and constitute a part of this specification. The drawings illustrate embodiments of the invention and, together with the description, serve to explain the principles of the invention. In the drawings.

DESCRIPTION OF THE PREFERRED EMBODIMENTS

This invention provides a white-light organic light-emitting diode (WOLED). Two luminescent layers are arranged on both sides of multiple luminescent layers to resolve the color shift of light emitting from the WOLED when the applied operating voltage varies.

The chromaticity coordinates (x, y) of standard white defined by Commission International d'Eclairage (CIE) is (0.33, 0.33). However, many other various white colors, such as cold white, warm white, sunlight white, or purple white, are still possible. Therefore, the chromaticity values of white color can vary within a broad range. However for white light generated by an ideal WOLED, the variation of x or y values in CIE coordinates is better when smaller than 0.04.

In preferred embodiments of this invention, four WOLEDs are produced. All layers are the same in the four WOLEDs except for multiple luminescent layers. The layers of four WOLEDs are sequentially an anode (Al, 1500 Å), an electron injection layer (LiF, 10 Å), an electron transfer layer (BAlq, 300 Å), multiple luminescent layers, a hole transfer layer (NPB, 200 Å), a hole injection layer (IDE 406:F4, 1500 Å) and a cathode (ITO). The multiple luminescent layers of the four WOLEDs above are listed in table 1 wherein device one and device two do not have symmetric red-light-emitting layers but have the same structure as that of a conventional WOLED. In device three and device four, which are designed according to the preferred embodiment of this invention, two symmetric red light-emitting layers are added on both sides of the blue-light-emitting layer.

TABLE 1

Luminescent layers of devices one to four are listed in the direction from cathode to anode.

| Thickness of luminescent layers (Å) | Device one | Device two | Device three | Device four |
|---|---|---|---|---|
| Red - light-emitting layer (CBP:RD07) | 100 | 100 | 50 | 50 |
| Blue - light-emitting layer (mCP:Ir-pyb) | 100 | 200 | 200 | 150 |
| Red light-emitting layer (CBP:RD07) | — | — | 50 | 50 |

TABLE 2

Luminescent intensities of blue and red light and the CIE chromaticity values of devices one to four.

| WOLED | Operating voltage (V) | Variation percentage of red light | Variation of CIE chromaticity |
|---|---|---|---|
| Device one (R100/B100) | 5-10 | 29.8% | (0.13, 0.02) |
| Device two (R100/B200) | 6-10 | 57.1% | (0.07, 0.02) |
| Device three (R50/B200/R50) | 7-12 | 66.3% | (0.05, 0.01) |
| Device four (R50/B150/R50) | 7-12 | — | (0.03, <0.01) |

Figure 1:
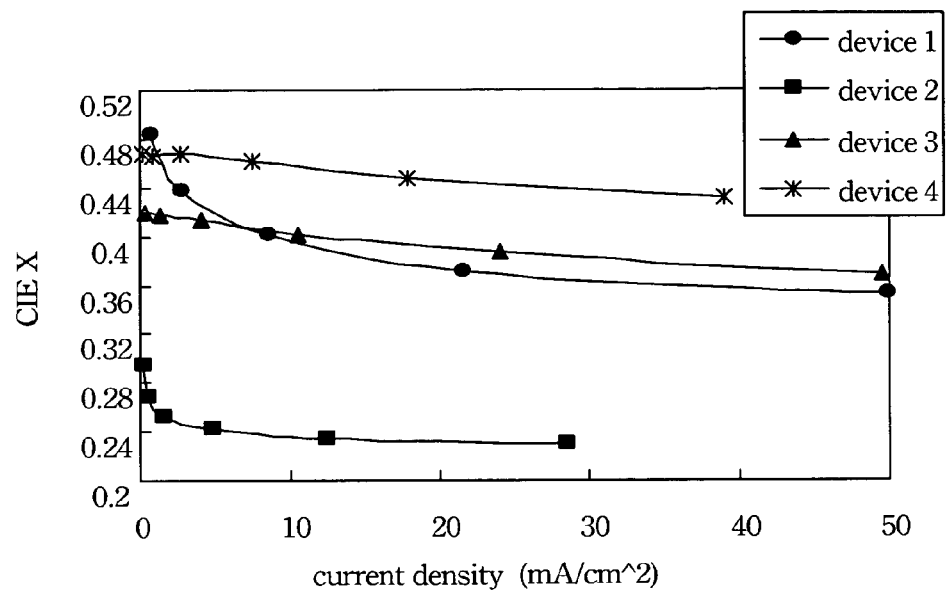
FIG. 1 is a diagram showing variation curves of CIE x values of devices one to four.
Figure 2:
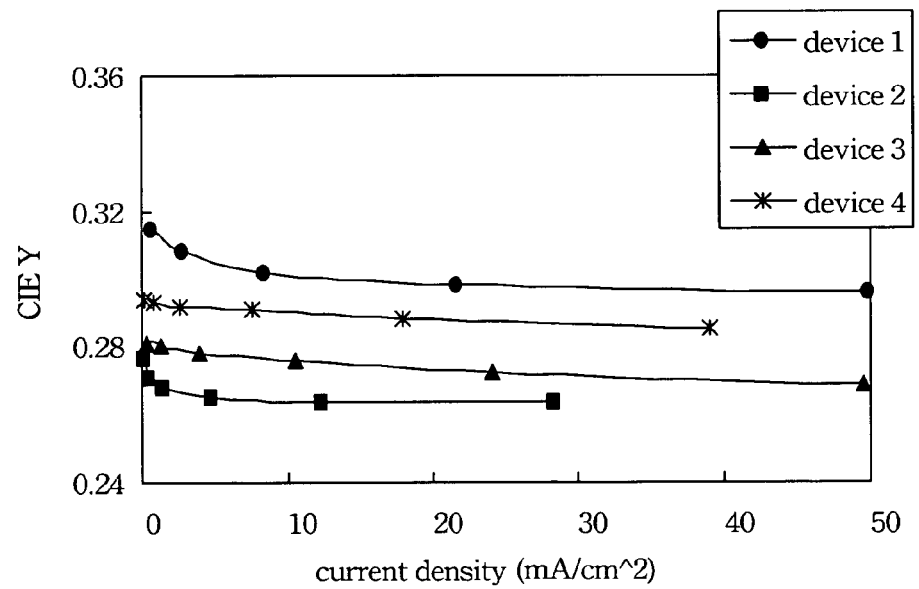
FIG. 2 is a diagram showing variation curves of CIE y values of devices one to four.

The experimental results of devices one to four are listed in Table 2, and the CIE chromaticity variations are shown in FIGS. 1 and 2. FIG. 1 is a diagram showing variation curves of CIE x values of devices one to four; and FIG. 2 is a diagram showing variation curves of CIE y values of devices one to four.

Referring to Table 2 and FIGS. 1 and 2, when applied voltage increases from 5 V to 10 V, the intensity of emitted blue light of device one (R100/B100) remained almost the same, and the relative peak intensity (about 466 nm) in the blue light spectrum was maintained at about 1. However, the intensity of emitted red light of device one (R100/B100) decreased from about 2.35 to about 0.7. That is, the relative peak intensity (about 625 nm) in the red light spectrum at 10 V was about 29.8% of that at 5 V. The CIE chromaticity value of device one varied from (0.47, 0.32) to (0.34, 0.30). The variation of the CIE chromaticity value was up to (0.13, 0.02).

After increasing the thickness of the blue light-emitting layer to form device two (R100/B200), the luminescence intensity of blue light of the device two remained almost the same, and the relative peak intensity (about 466 nm) in the blue light spectrum was maintained at about 1. However, the intensity of emitted red light of device two still decreased from about 0.35 to about 0.2. That is, the relative peak intensity (about 625 nm) in the red light spectrum at 10 V was about 57.1% of that at 6 V. The CIE chromaticity value of device two varied from (0.30, 0.28) to (0.23, 0.26). The variation of the CIE chromaticity value was up to (0.07, 0.02). Although the variation of CIE y values slightly decreased, the variation was still greater than the ideal variation range, i.e. smaller than 0.04.

From the experimental results of devices one and two, one can find that the color of the luminescence has a blue shift problem under high operating voltage. Therefore, it was hoped that the problem of unstable red light-emitting intensity could be solved if another red light-emitting layer was arranged on the other side of the blue light-emitting layer to form a structure of one blue light-emitting layer between two red light-emitting layers.

Reference is made to Table 2 and FIGS. 1 and 2 again. Although the device three (R50/B200/R50) used two red light-emitting layers, the total thickness of the two red light layers was still maintained at 100 Å. The luminescence intensity of blue light of the device three was also almost the same when the applied operating voltage increased from 7 V to 12 V. The relative peak intensity (about 466 nm) in the blue light spectrum was maintained at about 1. Contrary to devices one and two, the intensity of emitted red light of device three was only decreased from about 0.95 to about 0.63. That is, the relative peak intensity (about 625 nm) in the red light spectrum at 12V was still about 66.3% of that at 7 V. The variation of the CIE chromaticity value of device three varied from (0.43, 0.28) to (0.38, 0.27). The variation amplitude was (0.05, 0.01), which almost satisfied the requirement to be smaller than the ideal CIE variation (0.04).

The thickness of the blue light-emitting layer of device three was decreased to 150 Å to form device four. The luminescence intensity variation of blue and red light and the CIE chromaticity value variation with the applied voltage variation were also tested. The CIE chromaticity value of device four varied from (0.46, 0.29) to (0.43, >0.28). The variation amplitude was (0.03, <0.01), which satisfied the requirement to be smaller than the ideal CIE variation (0.04).

From the experimental results of devices three and four, although the total thickness of red light-emitting layer was not increased and was only divided to two layers located on both sides of the blue light-emitting layer, the blue shift problem of the WOLED luminescence color was also greatly improved. If luminescent material and thickness of each luminescent layer in WOLED can be further well designed, the problem of the luminescence color varying with the applied operating voltage can be further improved.

Figure 3:
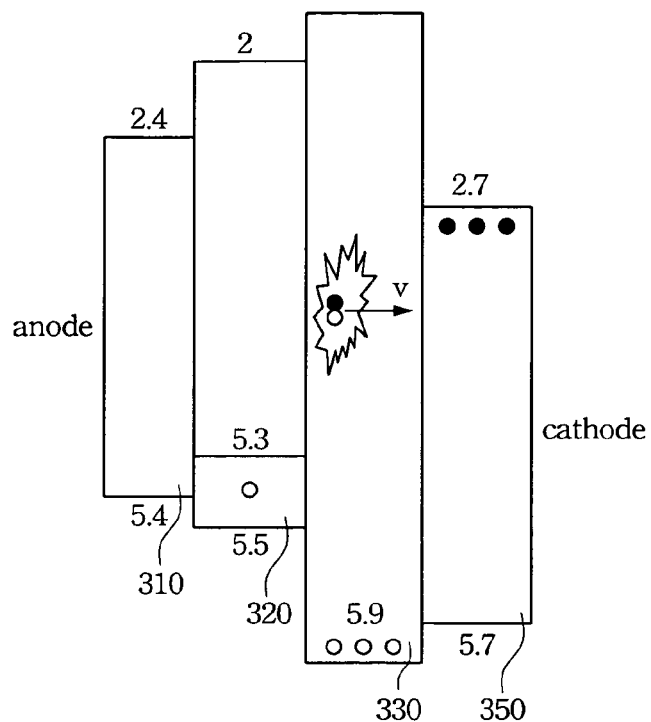
FIG. 3 is an energy diagram of conventional devices one and two, wherein every number shown near the bottom of each bar represents the energy level (in electron volts) of each highest occupied molecular orbital (HOMO), and every number shown near the top of each bar represents the energy level (in electron volts) of lowest unoccupied molecular orbital (LUMO)

The recombination region of electron and hole in a conventional WOLED is shifted when the applied operating voltage varies; hence the luminescent color of a conventional WOLED is also varied. FIG. 3 is an energy diagram of conventional devices one and two. Every number shown near the bottom of each bar represents the energy level (in electron volts) of each highest occupied molecular orbital (HOMO), and every number shown near the top of each bar represents the energy level (in electron volts) of lowest unoccupied molecular orbital (LUMO). In FIG. 3, in the direction from anode to cathode, only hole transfer layer 310, red light-emitting layer 320, blue light-emitting layer 330, and electron transfer layer 350 are shown. When devices one and two are operated under a low voltage, electrons generated from the cathode and holes generated from the anode are combined to form excitons at the interface of the red light-emitting layer 320 and the blue light-emitting layer 350. Then, the excitons release photons going back to ground state. When devices one and two are operated under a high voltage, the exciton-forming region is moved toward the cathode and apart from the red light-emitting layer 320. Hence, the luminescence intensity of the red light-emitting layer 320 is decreased.

Figure 4:
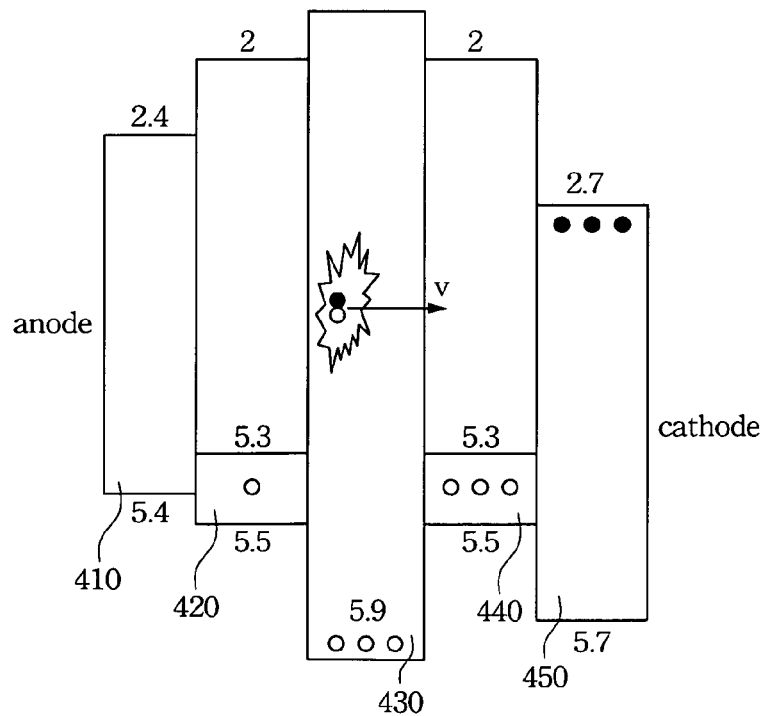
FIG. 4 is like FIG. 3 except that devices three and four are diagrammed.

FIG. 4 is an energy diagram of devices three and four according to a preferred embodiment of this invention. Again, every number shown near the bottom of each bar represents the energy level (in electron volts) of each highest occupied molecular orbital (HOMO), and every number shown near the top of each bar represents the energy level (in electron volts) of lowest unoccupied molecular orbital (LUMO). In FIG. 4, in the direction from anode to cathode, only hole transfer layer 410, red light-emitting layer 420, blue light-emitting layer 430, red light-emitting layer 440 and electron transfer layer 450 are shown. Two red light-emitting layers 420 and 440 with the same thickness are arranged to locate on either side of the blue light-emitting layer 430. When devices three and four are operated under a low voltage, excitons are generated at the central part of the blue light-emitting layer 450. When devices three and four are operated under a high voltage, the exciton-forming region is still moved toward the cathode to decrease the luminescence intensity of the red light-emitting layer 420. However, the red light-emitting layer 440 near the cathode can also emit red light to compensate for the red light intensity loss of the red light-emitting layer 420. Hence, the total red light-emitting intensity of devices three and four can be maintained without large variation when the applied operating voltage varies.

Although the thickness of the two red light-emitting layers according to the preferred embodiment of this invention are the same, the material and thickness of the two red light-emitting layers can also be different.

According to the same principle, the multiple luminescent layers of WOLED can also be, for example, red-blue-red, red-green-red, red-green-blue-green-red, red-green-blue-red, red-blue-green-red, blue-red-green-red-blue, or blue-green-red-blue. The two outermost luminescent layers are better when generating the same or similar color light. Therefore, no matter whether the excitons diffuse toward the anode or cathode, the various luminescent intensity of each color light can be maintained at a rather constant value.

In light of the foregoing, since the two outermost luminescent layers of the WOLED, according to the preferred embodiments of this invention, generate the same or very similar color light, the color shift problem when applied operating voltage varies can be solved.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An white-light organic light-emitting diode sequentially having an anode, a luminescent vertical-stacked layer, and a cathode, wherein the luminescent vertical-stacked layer comprising:
   two symmetric luminescent layers for generating a first color light;
   a first central luminescent layer, interposed between the two symmetric luminescent layers, for generating a second color light, which is different from the first color light; and
   a second central luminescent layer, interposed between the two symmetric luminescent layers, for generating a third color light, which is different from the first color light.

2. The white-light organic light-emitting diode of claim 1, wherein when a voltage applied to the organic light-emitting device changes to cause decreasing luminescent intensity of one of the two symmetric luminescent luminescent layer, the luminescent intensity of the other of the two symmetric luminescent layer automatically increases to compensate for the decreased luminescent intensity of the one of the two symmetric luminescent luminescent layer.

3. The white-light organic light-emitting diode of claim 1, wherein the two symmetric luminescent layers are made of the same material.

4. The white-light organic light-emitting diode of claim 1, further comprising a hole transfer layer and an electron transfer layer arranged adjacent to two outer surfaces of the two symmetric luminescent layers, respectively.

5. An white-light organic light-emitting diode sequentially having an anode, a luminescent vertical-stacked layer, and a cathode, wherein the a luminescent vertical-stacked layer sequentially comprising:
   a first luminescent layer for generating first component of a first color light;
   a second luminescent layer for generating a second color light different from the first color light; and
   a third luminescent layer for generating a second component of the first color light, when a voltage applied to the organic light-emitting device changes to cause decreasing luminescent intensity of the first luminescent layer, the luminescent intensity of the second luminescent layer automatically increases to compensate for the decreased luminescent intensity of the first luminescent layer.

6. The white-light organic light-emitting diode of claim 5, wherein the first and the third luminescent layers are made of the same material.

7. The white-light organic light-emitting diode of claim 5, further comprising a fourth luminescent layer interposed between the second luminescent layer and the third luminescent layer, wherein the fourth luminescent layer is configured to generate a third color light different from the first color light.

8. The white-light organic light-emitting diode of claim 5, further comprising an electron transfer layer between the first luminescent layer and the anode, and a hole transfer layer between the third luminescent layer and the cathode.

* * * * *